United States Patent [19]
Horiike et al.

[11] Patent Number: 5,185,132
[45] Date of Patent: Feb. 9, 1993

[54] ATOMSPHERIC PLASMA REACTION METHOD AND APPARATUS THEREFOR

[75] Inventors: Yasuhiro Horiike, Hiroshima; Satiko Okazaki, Tokyo; Masuhiro Kogoma, Saitama, all of Japan

[73] Assignee: Research Development Corporation of Japan, Tokyo, Japan

[21] Appl. No.: 623,613

[22] Filed: Dec. 7, 1990

[30] Foreign Application Priority Data

Dec. 7, 1989 [JP] Japan ................................ 1-318260

[51] Int. Cl.⁵ .................... B01J 19/08; B01J 19/12; C23C 14/22; C23C 14/28
[52] U.S. Cl. .......................... 422/186.05; 422/186.3; 118/720
[58] Field of Search .............. 422/186, 186.05, 186.04, 422/186.06, 186.3; 118/718, 719, 720

[56] References Cited

U.S. PATENT DOCUMENTS

| | | | |
|---|---|---|---|
| 3,959,104 | 5/1976 | Faips | 204/164 |
| 4,013,532 | 3/1977 | Cormia et al. | 204/192 |
| 4,224,897 | 9/1980 | Dugdale | 118/719 |
| 4,233,109 | 11/1980 | Nishizawa | 156/643 |
| 4,365,587 | 12/1982 | Hirose et al. | 118/723 |
| 4,642,171 | 2/1987 | Sekine et al. | 204/298 |
| 4,992,299 | 2/1991 | Hochberg | 427/38 |

FOREIGN PATENT DOCUMENTS

86/07391 12/1986 PCT Int'l Appl. ................. 118/718

*Primary Examiner*—Donald P. Walsh
*Assistant Examiner*—Daniel Jenkins
*Attorney, Agent, or Firm*—Wenderoth, Lind & Ponack

[57] ABSTRACT

This invention provides an atmospheric plasma reaction method characterized by introducing a mixed gas of rare gas and reactive gas into a reaction vessel having a dielectric-coated electrode wherein the surface of two or more electrodes located parallel therewith are provided with solid dielectrics, exciting said mixed gas with plasma at atmospheric pressure, then transporting the active species to the downstream of the plasma and treating the surface of a substrate.

This invention also provides an atmospheric plasma reaction apparatus.

4 Claims, 6 Drawing Sheets

ATOMSPHERIC PLASMA REACTION METHOD AND APPARATUS THEREFOR

FIELD OF THE INVENTION

The present invention relates to an atmospheric plasma reaction method and apparatus therefor. More particularly, this invention relates to an atmospheric plasma reaction method and apparatus therefor wherein stable glow discharge plasma is generated under atmospheric pressure, and also the active species generated by this atmospheric plasma is transported downstream for treating a surface and/or forming a thin film on a large-size substrate.

PRIOR ART

Conventionally, a film-forming or surface treatment method with low pressure glow discharge plasma has been widely known, and has found extensive applications in various industrial fields. As the surface treatment method with low-pressure glow discharge plasma, the so-called plasma etching method wherein etching and thin film formation are conducted by the plasmatization of reactive gases including halogen atoms and silicon atoms, and a deposit method therefor known.

Such plasma etching method and deposit method include etching of silicon and oxidized silicon film with Freon gas and other carbonfluoride plasma in a vacuum container, and depositing of amorphous silicon film, oxidized silicon film or nitride silicon film onto a silicon substrate or glass substrate by plasma-exciting silane gas or a mixed gas of oxygen or ammonia gas therewith.

However, the surface treatment methods of low-pressure glow discharge plasma, as has conventionally been known, use reactions under vacuum of some $1\times 10^{-2} - 1$ Torr, and hence a device and equipment for forming these low-pressure conditions were required. It was also difficult to treat a large-area substrate and the production cost was inevitably high.

One of the inventors of the present invention has already proposed a plasma reaction method for plasma exciting monomer gas introduced in a mixed gas with rare gas under atmospheric pressure and treating the surface of a substrate. He has put this method into application, achieving a surface with superb characteristics and functions. However, there was a limit to the treatment of a surface even by this method, and particularly in the case where the substrate is a metal or alloy, arc discharge occurred under atmospheric pressure, making the treatment difficult. In addition, the treatment area depends on the area of an electrode, and hence it was difficult to treat a large area.

SUMMARY OF THE INVENTION

The present invention has been made considering the aforestated circumstances, and is a further expansion of the method already proposed. It has an objective of providing an atmospheric plasma reaction method and apparatus therefor which can give plasma with reaction activity and stability under atmospheric pressure, without any arc discharge occurring even in the case where the substrate is a metal or an alloy or is a large area substrate.

This invention provides an atmospheric plasma reaction method characterized by introducing a mixed gas of rare gas and reactive gas into a reaction vessel having a dielectric coated electrode wherein the surface of two or more electrodes located parallel there with are provided with solid dielectrics, exciting said mixed gas with plasma at atmospheric pressure, then transporting the active species to the downstream of the plasma and treating the surface of a substrate.

This invention also provides an atmospheric plasma reaction apparatus comprising a gas introducing unit for introducing mixed gas of rare gas and reactive gas into a reactive vessel, an atmospheric plasma generation unit wherein a dielectric-coated electrode where a solid dielectric is produced on the surfaces of two or more electrodes located parallel therewith is provided vertical to the substrate, and a surface-treatment unit for treating the surface of the substrate downstream of the plasma-generating region at the atmospheric plasma generation unit.

DETAILED DESCRIPTION OF THE INVENTION

Figure 1:
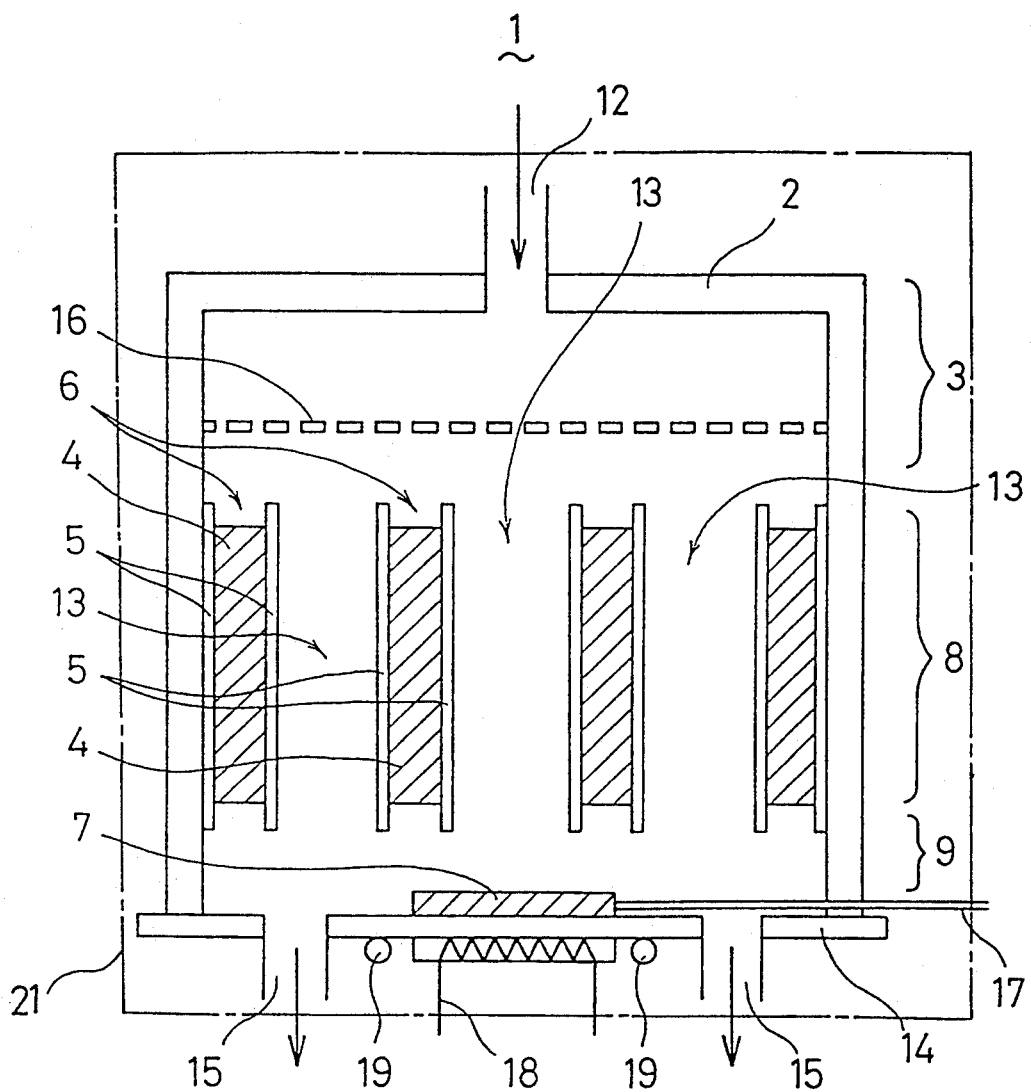
FIG. 1 is a sectional view illustrating one of the embodiments of an atmosphere plasma reaction apparatus of this invention.

In an atmospheric plasma reaction method according to the present invention and the apparatus therefor, a mixed gas of rare gas with reactive gas is used, and dielectric-coated electrodes with which a solid dielectric is provided are located perpendicular to a substrate, and a surface treatment portion for supporting a substrate and treating the surface thereof is provided downstream of the plasma-generating portion of an atmospheric plasma generating unit, making possible stable glow discharge and the surface-treatment of a large-area substrate. Even where the substrate is a metal or an alloy, stable glow discharge can be obtained, and where it is a large-area substrate, the surface treatment can be ensured.

Detailed descriptions will be made as to the embodiments of this invention while referring to the drawings.

FIG. 1 is a sectional view of one of the embodiments illustrating an atmospheric plasma reaction apparatus of this invention.

As shown in this example, the apparatus according to the present invention comprises a gas introducing unit (3) for introducing mixed gas (1) of rare gas and reactive gas into a rection vessel (2) consisting of Teflon plate and which is kept at atmospheric pressure, an atmospheric plasma generating unit (8) wherein dielectric-coated electrodes (6) with a solid dielectric (5) provided on the surfaces of two or more electrodes (4) located parallel with each other is located perpendicular to a substrate (7) and, a surface treatment unit (9) which supports the substrate (7) downstream of the plasma generating portion of the atmospheric plasma generating unit (8) and treats the surface thereof with the active species generated.

Generally, glow discharge will not occur readily under atmospheric conditions. Arc discharge occurs by applying high voltage, and hence it becomes difficult to perform the surface treatment of a substrate.

In this invention, however, glow discharge under atmospheric pressures is made possible by using a mixed gas (1) of reactive gas with rare gas, locating dielectric-coated electrodes (6) with solid dielectrics (5) provided on electrodes (4) perpendicular to a substrate (7), and providing a surface treatment unit (9) for supporting the substrate (7) downstream of the plasma generating region of the atmospheric plasma generating unit (8).

Even when the substrate (7) is a metal or an alloy, a stable glow discharge can be obtained, and even when it is a large-area plate, the surface treatment of said substrate can be ensured. Needless to say, when the substrate is made of ceramics, glass, plastic or rubber, stable glow discharge is ensured and a substrate of large area can be subjected to surface treatment.

Figure 2:
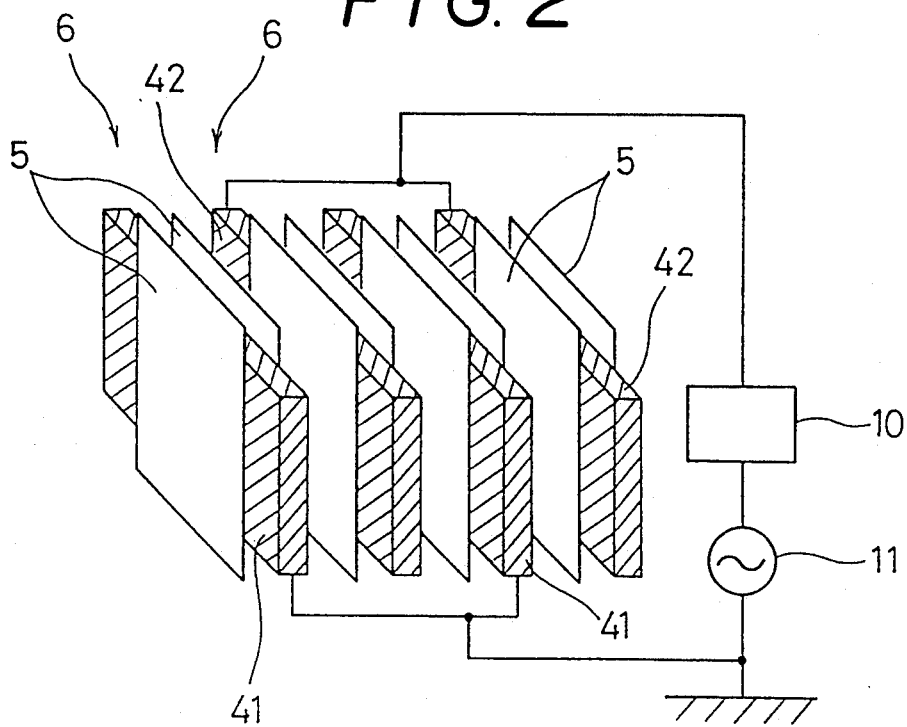
FIG. 2 is a perspective view illustrating the structure of a dielectric-coated electrode.

FIG. 2 illustrates the structure of dielectric coated electrodes (6) located in an atmospheric plasma generating unit (8) which excites a mixed gas (1) of rare gas and reactive gas under atmospheric pressures.

In this example, a total of four electrodes parallel, plate ground electrodes (41) (42), two pairs each provided parallel with each other, are used. A high-frequency electric field is applied from a high-frequency power supply (11) to the high-frequency electrodes (42) via a matching device (10). Both sides of each of these electrodes (41) (42) are provided with a solid dielectric field (5). The materials of the solid dielectric field (5) include glass, ceramics, plastic and other heat-resistant materials.

A mixed gas of rare gas and reactive gas is excited with glow discharge using such dielectric-coated electrodes (6), generating high-energy plasma. The formation of this plasma is provided by the application of high voltage from the high-frequency power supply (11). The voltage applied at that time may be arbitrary depending on the property of the surface of the substrate and the time from which the surface is treated.

There is no special limitation to the number of electrodes, but any number of two or more is acceptable. Nor is there any specific limitation to the materials of the electrodes (41) (42). Stainless steel and other given material may be used.

As illustrated in FIG. 1, a mixed gas (1) of rare gas and reactive gas is introduced into a reaction vessel (2) through a gas introducing port (12) provided on the reaction vessel (2), passes through a space (13) and is dispersed evenly at an atmospheric plasma generating unit (8). Gases from a reaction product, unreacted portion of reactive gas and rare gas are discharged via an exhaust port (15).

To obtain more stable plasma at atmospheric pressure, it is preferred to disperse and supply a mixed gas (1) of rare gas and reactive gas to the plasma generating region in the vicinity of dielectric-coated electrodes (6). For this reason, in this example, a multi-port plate (16) is also provided.

At a substrate support (14), a temperature sensor (17) which measures the temperature of the substrate (7) of a thermocouple, a heater (18) for heating the substrate (7), and a water-cooled pipe (19) for cooling the substrate (7), are also provided. These means may be arbitrarily provided.

There is no specific limitation to mixed gas (1), but as rare gas to be used, He, Ne and Ar can used singularly or in combination with other substances. To prevent arc discharge and provide stable glow discharge, it is preferred to use He, a gas with light mass. For reactive gases to be introduced in combination with rare gases, silicon hydrogases such as silane ($SiH_4$) and disilane ($Si_2H_6$) or halogenated hydrocarbon including $CF_4$, $C_2F_5$, $CHF_3$ or $SF_5$ and hydrocarbons with or without other functional groups may be used arbitrarily. Reactive gases with multiple species can be mixed and used for that application. Furthermore, depending on the reactive gases to be used, halogen, oxygen, and hydrogen may be added to the mixed gas to accelerate the reaction. There is no specific limitation to the mixing ratio of rare gas with reactive gas, but it is preferred to make the density of rare gas about 65% or higher, especially 90% or higher.

When these gases used for the reaction are released into the atmosphere, there are some cases where they will cause safety problems including fire and undesirable effects upon the human body. In order to avoid this, it becomes necessary to detoxify these gases. Since the gases such as He are expensive, it is prefered to collect them for reuse. Given these, the apparatus of this invention can be covered with a container (21) separate from the reaction vessel (2) which is used to isolate the plasma reaction system from the atmosphere. Using a pump and other appropriate exhaust means connected to the isolation container (21), the pressure inside can be reduced to approx. 0.5 to 0.1 atmospheric pressure. The discharge mechanism for this is identical to that under atmospheric pressure.

According to the type and reaction conditions of reactive gases to be used, plasma polymer film, deposit film, plasma treatment film or plasma etching surface can be obtained.

Figure 3:
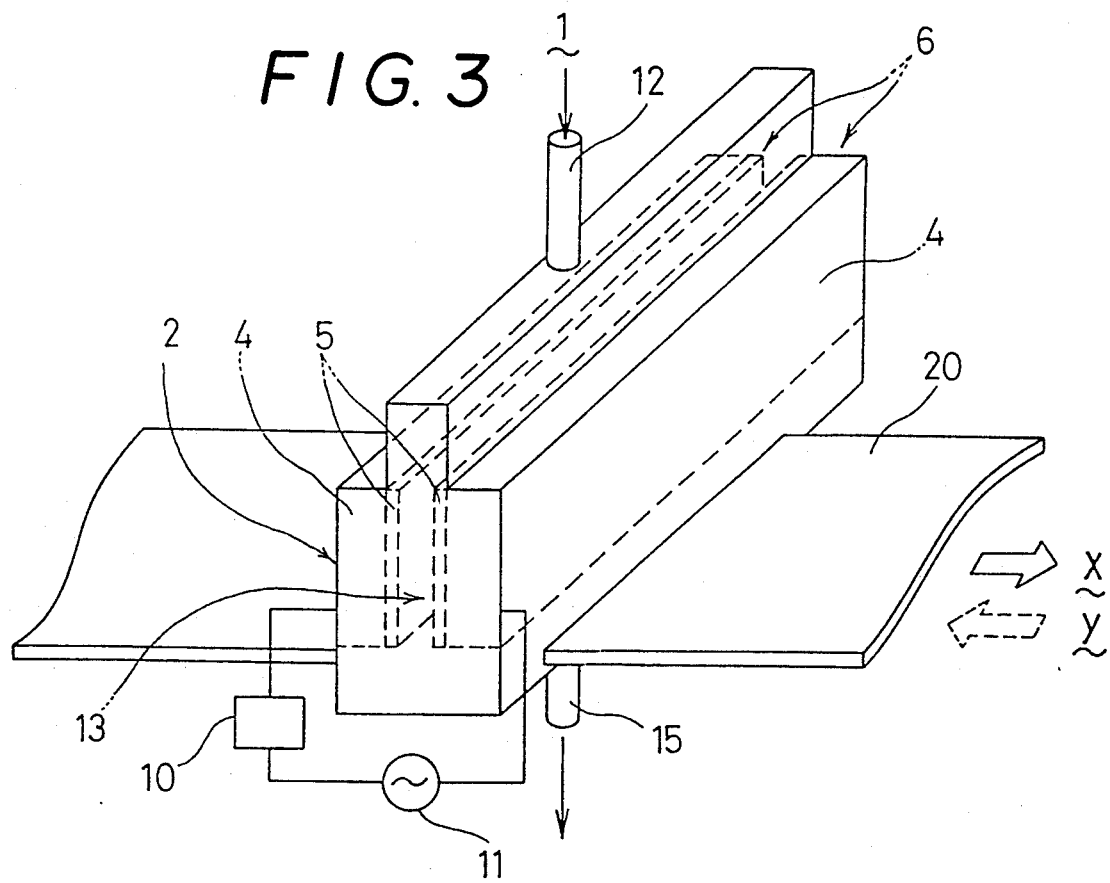
FIG. 3 is a perspective view illustrating another embodiment of an atmosphere plasma reaction apparatus of this invention.

FIG. 3 is a perspective diagram of another example of the atmospheric plasma reaction apparatus of this invention.

In this example, a pair of dielectric-coated electrodes (6) with a solid dielectric (5) provided on one of the sides of the electrodes (4) and longer in the cross direction of a substrate (20) are provided inside a convex reaction vessel (2), so that the substrate (20) is scanned in the directions of an arrow (x) and/or an arrow (y). This ensures that if the substrate (20) is a large-area substrate, the surface can be treated. When this apparatus is used for surface treatment, it is preferred to scan the substrate (20) in both directions of the arrows (x) (y) to provide a more evenly treated surface.

In this case also, to prevent the gases from dispersing into the atmosphere, the whole apparatus can be covered by an isolation container different from the reaction vessel (2). With an appropriate exhaust means such as a pump, the internal pressure can be reduced to approx. 0.5 to 0.1 atmospheric pressure. The discharge mechanism for this operation is similar to that under atmospheric pressure.

Now, a description will be made as to the specific examples of surface treatment.

TREATMENT EXAMPLE 1

Figure 4:
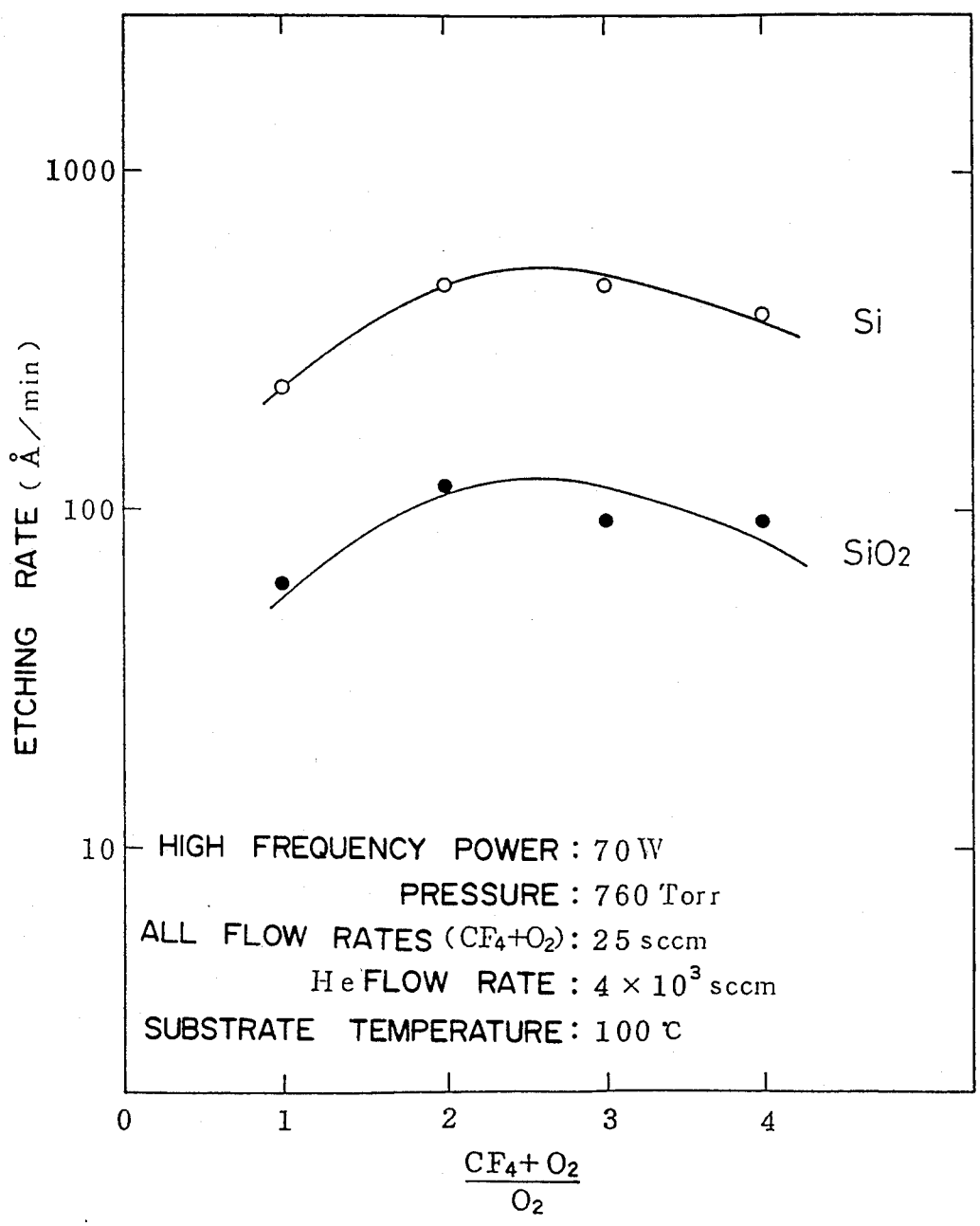
FIGS. 4 and 5 are correlation drawings which show the relationships between the etching speed of Si and $SiO_2$ at substrate temperatures of 100° C. and 20° C. and the concentration of $O_2$ in $CF_4$.

In an apparatus as described in FIG. 1 wherein four plate electrodes with a square shape having a 30 mm side are used, and glass plate-coated electrodes, located parallel with each other in a clearance of 4 mm, were provided at an atmosphere plasma generating portion, 1 cm$^2$ single crystal silicon (100) and thermally oxidized film were provided 1 cm apart from the bottom of the dielectric-coated electrodes. These substances were heated to 100° C. to vary the concentration of O$_2$ in CF$_4$ for plasma etching. The total flow of CF$_4$+O$_2$ was kept constant at 25 sccm, and the flow rate of He at 4×10$^3$ sccm. A high-frequency power at 13.56 MH$_2$ was set at 70 V. The result is shown in FIG. 4.

The single crystal silicon and thermally treated film were subjected to etching. The etching speed was maximum at approx. 2.5 (CF$_4$+O$_2$)/O$_2$ ratio, i.e., it was confirmed that when CF$_4$ was approx. 30 cc and O$_2$ was some 70 cc, the silicon (Si) and the oxidized film (SiO$_2$) attained the maximum etching speed.

During the etching operation, no arc discharge occured, and glow discharge ocurred under stable atmospheric pressures, giving highly active plasma.

TREATMENT EXAMPLE 2

Figure 5:
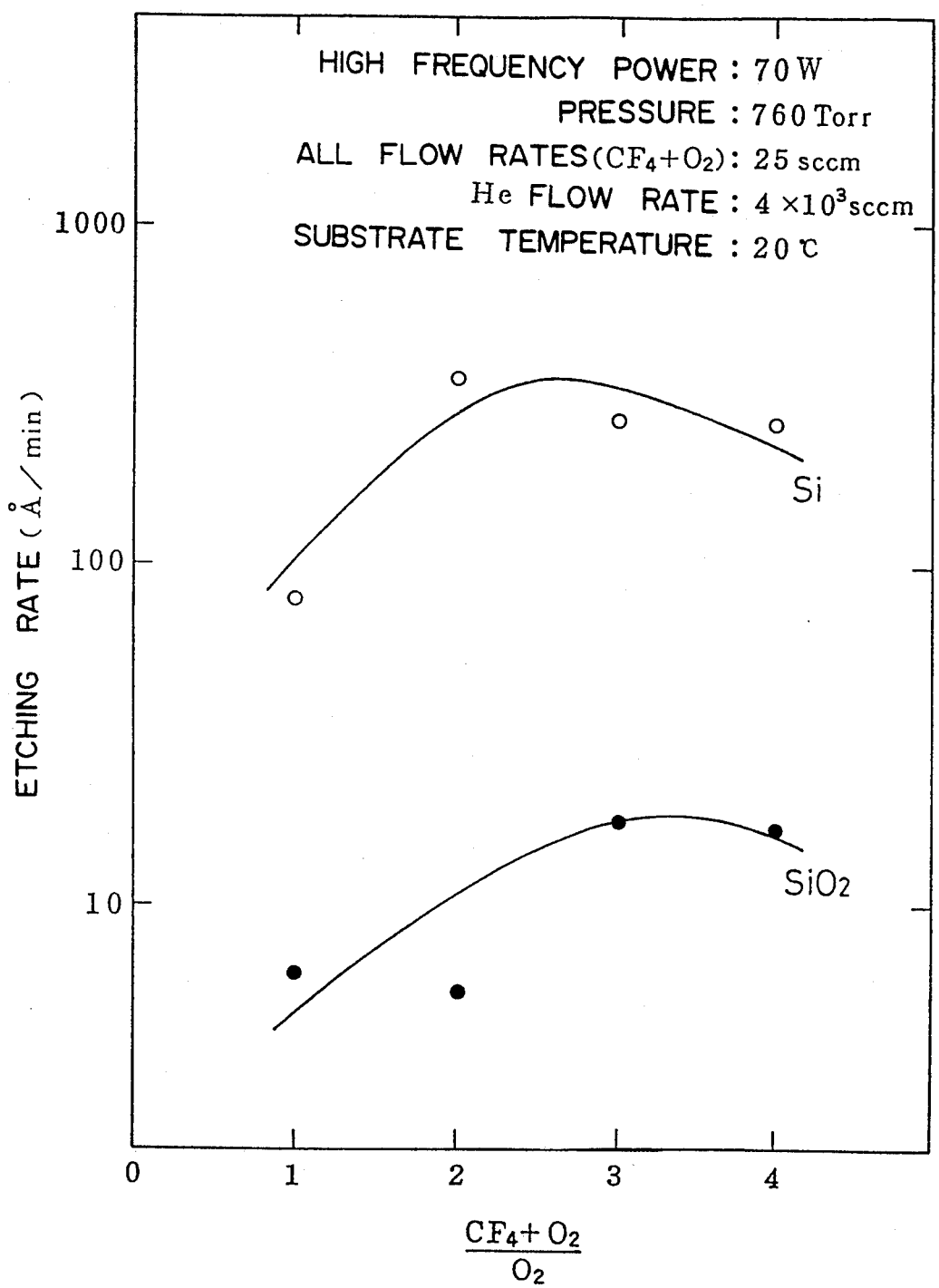

Under the same condition as in Example 1, except for setting the temperature of the substrate at 20° C., a single crystal silicon and thermally oxidized film were subjected to etching. The result is shown in FIG. 5. As is shown by a comparison with FIG. 4, it was found that the etching speed of the silicon (Si) does not change greatly with substrate temperatures, but that the etching speed of oxidized film (SiO$_2$) decreases substantially, improving the selection ratio of Si/SiO$_2$ more than 15 times.

In this case also, no arc discharge occurred and glow discharge occurred under stable atmospheric pressures, giving highly active plasma.

TREATMENT EXAMPLE 3

Figure 6:
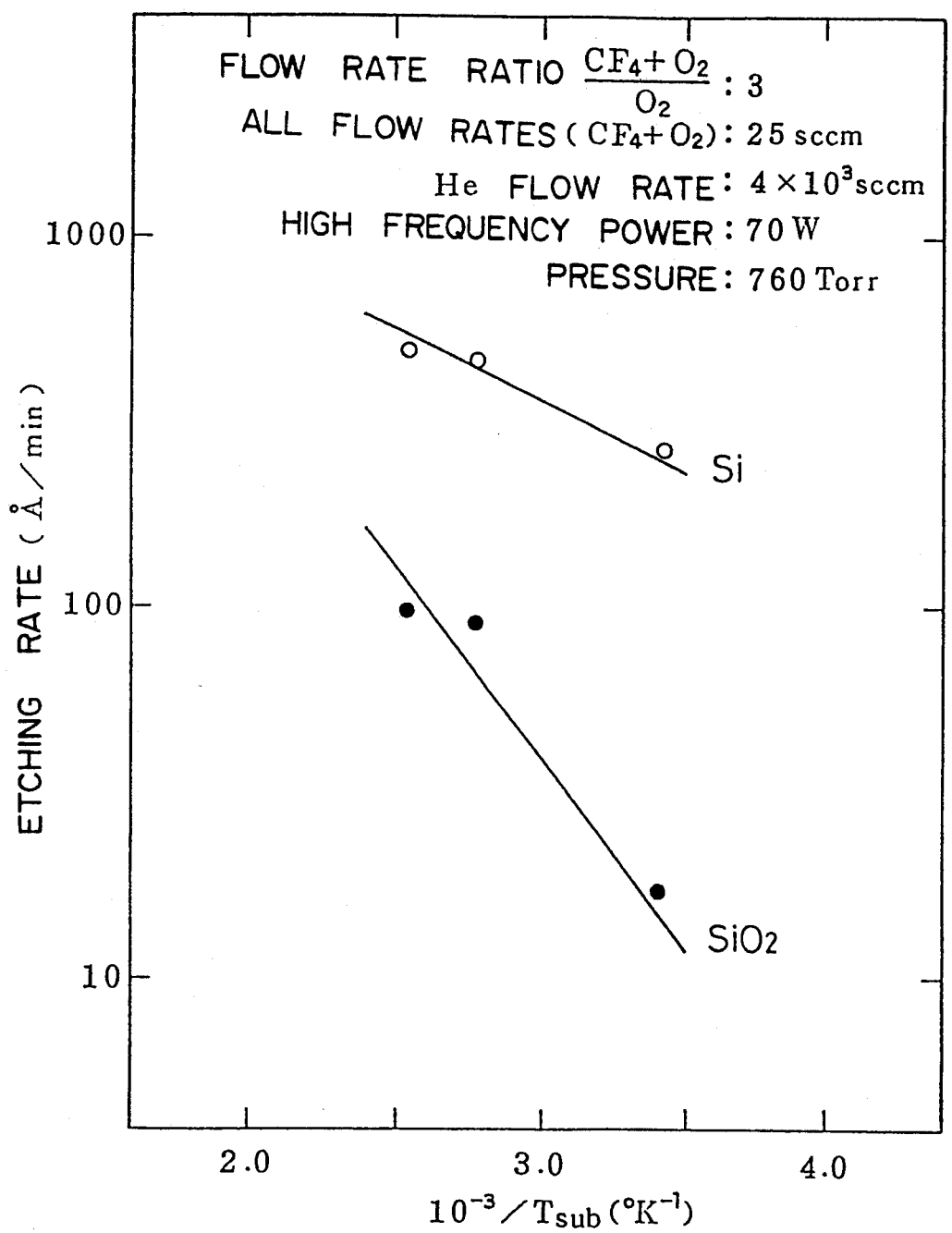
FIG. 6 is a correlation drawing showing the relationships between the etching speeds of Si and $SiO_2$ and substrate temperatures.
Figure 7:
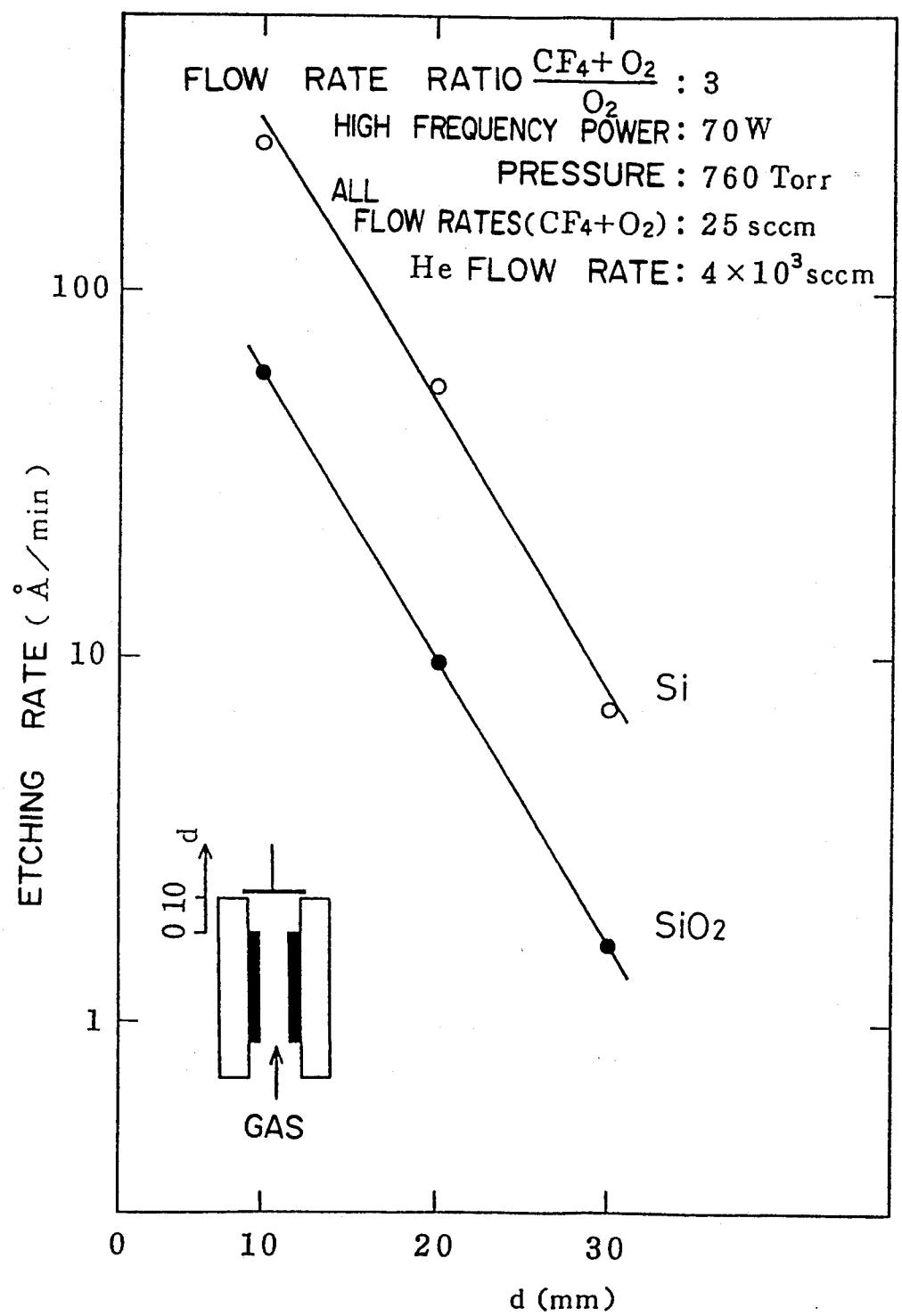
FIG. 7 is a correlation drawing showing the relationships between the etching speeds of Si and $SiO_2$ and the location of the substrates.

Keeping the flow rate ratio of (CF$_4$+O$_2$)/O$_2$ at 3 and varying substrate temperatures, the etching speed of a single crystal silicon and thermally oxidized film were observed. The result is indicated in FIG. 6.

The single crystal silicon and thermally oxidized film were subjected to etching. As is evident from FIG. 6, it was confirmed that the selection ratio of Si/SiO$_2$ became enormously larger as the substrate was cooled.

In this case also, during the etching operation, glow discharge occurred, giving highly active plasma. No arc discharge occurred.

TREATMENT EXAMPLE 4

Under similar conditions as in Example 3 and varying the location of the substrates with regard to dielectric-coated electrodes, the etching speed of the silicon (Si) and thermally oxidized film (SiO$_2$) was observed. The location of the substrate in this case was further apart from those in Examples 1 to 3.

It was determined that the etching speeds of both the silicon (Si) and thermally oxidized film (SiO$_2$) decrease as they are more distant from the dielectric-coated electrodes, but that an effective etching speed was achievable even when those substrates are 3 cm distant from the electrodes.

The present invention is not limited to the above examples. Various configurations can be realized depending on the geometry, size and material of the reaction vessel, the construction and structure of the dielectric-coated electrode, the type and flow rate of rare gas and reactive gas, the quantity of applied power, substrate temperature, and the location and distance of the substrate from the dielectric-coated electrodes.

When the pressure inside the container is to be reduced for the exhaust and disposal of reactive gas and reaction product and the collection of He and other rare gases, the discharge machanism is similar to the one under atmospheric pressure.

As has been described in detail, this invention makes it unnecessary to use a device and equipment for the formation of vacuum, reduces cost, and achieves surface treatment under atmospheric pressures, as compared with the conventional low-pressure glow discharge plasma reaction method. Since the structure and construction of the apparatus are simple, it becomes easier to perform surface treatment of a large-area substrate. The desired surface treatment can be obtained regardless of the materials and size of the substrate.

We claim:

1. An atmospheric plasma reaction method comprising introducing a mixed gas of rare gas and reactive gas into a reaction vessel having dielectric-coated electrodes wherein the surface of two or more electrodes located parallel with each other are provided with solid dielectric, and wherein a substrate is provided downstream of said electrodes, exciting said mixed gas with plasma at atmospheric pressure to produce an active species, and treating the surface of said substrate with said active species.

2. The method as described in claim 1, wherein said reactive gas has halogen atoms.

3. An atmospheric plasma reaction apparatus comprising a reaction vessel, a gas introducing means for introducing a mixed gas of rare gas and reactive gas into said reaction vessel, an atmospheric plasma generation unit wherein dielectric-coated electrodes having solid dielectric on the surfaces of two or more electrodes located parallel with each other is provided vertical to a substrate to be treated downstream of said plasma generation unit, and a surface-treatment unit for treating the surface of the substrate downstream of said plasma generation unit.

4. The apparatus as described in claim 3, further comprising an isolation vessel exterior to said reaction vessel provided to reduce the pressure in an area between said isolation vessel and reaction vessel to 1/10 atmospheric pressure.

* * * * *